United States Patent [19]
Sakamoto et al.

[11] Patent Number: 5,638,246
[45] Date of Patent: Jun. 10, 1997

[54] SEMICONDUCTOR DEVICE HAVING A PROTECTION CIRCUIT, AND ELECTRONIC SYSTEM INCLUDING THE SAME

[75] Inventors: Kozo Sakamoto, Hechiouji; Isao Yoshida, Nishitama-gun; Masatoshi Morikawa, Hachiouji; Shigeo Ohtaka, Takasaki; Hideki Tsunoda, Akishima, all of Japan

[73] Assignees: Hitachi, Ltd.; Hitachi VLSI Engineering Corporation, both of Tokyo, Japan

[21] Appl. No.: 10,572

[22] Filed: Jan. 28, 1993

[30] Foreign Application Priority Data

Jan. 31, 1992 [JP] Japan ........................ 4-015913

[51] Int. Cl.⁶ .................................. H02H 5/04
[52] U.S. Cl. .............................. 361/103; 361/58
[58] Field of Search ........................... 361/19, 52, 56, 361/86–88, 97, 91, 93, 94, 98, 100, 101, 103, 106; 323/265, 266, 274–277, 281, 283, 285, 311, 312, 901, 907, 908

[56] References Cited

U.S. PATENT DOCUMENTS

| | | | |
|---|---|---|---|
| 4,750,079 | 6/1988 | Fay et al. ................... | 361/101 |
| 4,837,458 | 6/1989 | Kawahata et al. ............ | 361/58 |
| 5,128,823 | 7/1992 | Fujimoto et al. ............. | 361/98 |

Primary Examiner—Jeffrey A. Gaffin
Assistant Examiner—Ronald W. Leja
Attorney, Agent, or Firm—Antonelli, Terry, Stout & Kraus, LLP

[57] ABSTRACT

In a semiconductor device including a power MOSFET ($M_0$) for the output stage, a temperature detection circuit produces an output signal upon detecting an abnormal rise in the chip temperature, the signal turns on a set input element ($M_1$) in a latch circuit so that the latch circuit becomes a set state, the set output of the latch circuit turns on a control element ($M_5$), causing the power MOSFET to become non-conductive so that it is protected from destruction. The latch circuit is not brought to a reset state even if the external gate terminal of the device is brought to zero volt. With a voltage outside the range of the normal input signal, e.g., a large negative voltage, being applied to the external gate terminal, the gate capacitance of the control element ($M_5$) discharges, and consequently the latch circuit is brought to the reset state and the protective operation is cancelled. The semiconductor device is further provided with an external reset terminal, and the protective operation can also be cancelled through the application of a reset signal to the external reset terminal. The semiconductor device is protected from destruction and also from deterioration of characteristics of the power MOSFET ($M_0$), and yet the protective operation is not cancelled erroneously by the normal input signal.

41 Claims, 6 Drawing Sheets

SEMICONDUCTOR DEVICE HAVING A PROTECTION CIRCUIT, AND ELECTRONIC SYSTEM INCLUDING THE SAME

BACKGROUND OF THE INVENTION

1. Field of the Invention

The present invention relates to a semiconductor device having a protection circuit and to an electronic system including the device, and more particularly to a field effect transistor of the insulated gate type having a protection circuit formed on the same semiconductor chip.

2. Description of the Prior Art

Field effect transistors of the insulated gate type designed to deal with large power are generally called "power MOSFETs", and they have associated protection circuits on the same semiconductor chip.

The publication ELECTRONIC DESIGN published on Dec. 5, 1991 introduces in its article of TECHNOLOGY NEWSLETTER a 3-pin power MOSFET device having integrated protective functions against events of short-circuit, over-temperature and over-voltage. According to the article, this power MOSFET device manufactured by Philips Semiconductors in Holland operates based on the associated protection circuit to bring the device into a cutoff state if the junction temperature rises beyond a safe level of about 180° C., and the cutoff state is retained by a latch circuit included in the over-temperature and short-circuit protection circuit until the control input is brought to a low level.

Another publication TECHNICAL PUBLICATION PRODUCT INFORMATION SCO12 published by Philips Semiconductors introduces in its article entitled "TOPFET: a new concept in protected MOSFET", pp. 1–4, a brief internal block diagram of a 3-pin MOSFET having integrated protective functions against events of short-circuit, over-temperature and over-voltage. The article reports that when the overload protection circuit operates (due to over-temperature or short-circuit), the power MOSFET of the output stage has its gate signal latched to a low voltage level so that it is kept cutoff, and this protection state remains so far as the input voltage is above a latch reset threshold of 3.5 to 4.5 volts.

SUMMARY OF THE INVENTION

The above-mentioned conventional power MOSFETs are designed to retain the protective operation so far as the control input is high, and to cancel the protective operation when the control input falls below the latch reset threshold.

However, study by the inventors of the present invention has revealed the fact that when this MOSFET is driven by a pulsative input signal having a lower level below the latch reset threshold, the protective operation caused by some overload condition is cancelled unfavorably.

The implementation of protective operation against short-circuit, over-temperature and over-voltage of a power MOSFET signifies that the operational environment of the power MOSFET has turned from a safe state to a dangerous state. When the protective operation is cancelled in response to a low-level portion of the pulsative input signal before the safe operational environment is restored, the power MOSFET resumes the active operation in response to a high-level portion of the pulsative input signal. Consequently, the power MOSFET falls into a state of over-temperature, over-voltage, overload, or over-current, causing the protection circuit to act again.

Accordingly, when a power MOSFET is driven by a pulsative input signal in a critical operational environment, it operates in a protected state and non-protected state alternately depending on the duty cycle of the input signal. The power MOSFET is subjected to the electrical stress for a long period of time due to the switching operation in the critical environment, and although it will not be destroyed in a short time, the electrical characteristics of the power MOSFET may possibly deteriorate significantly below the intended performance, such as the degradation of output power or the retardation of detection of abnormal load conditions. This situation adversely affects the reliability of electronic circuits in which these power MOSFETs are incorporated and the safety of electronic systems which use these circuits.

The present invention is based on the foregoing study of the prior art deficiency, and its object is to provide a semiconductor device which retains the protective operation for the power MOSFET irrespective of a conventional input signal level.

In order to achieve the above objective, the semiconductor device based on an embodiment of this invention comprises a power MOSFET ($M_0$), an operation state detection circuit ($M_1$) which detects an electrical value relating to the operation state of the power MOSFET, a latch circuit ($M_2$, $M_3$, $M_4$) which latches the states of the output of the operation state detection circuit ($M_1$), a control element ($M_5$) which causes a path between the gate and source electrodes of the power MOSFET ($M_0$) to become conductive in response to the output of the latch circuit, and an external gate terminal for supplying the drive signal to the gate electrode of the power MOSFET ($M_0$).

According to the features of this semiconductor device, the drive signal voltage received on the external gate terminal is also used as a power voltage for the operation state detection circuit ($M_1$) and latch circuit ($M_2$, $M_3$, $M_4$), the drive signal has a signal level in a predetermined range, and the control element ($M_5$) operates so that the path between the gate and source electrodes of the power MOSFET ($M_0$) becomes non-conductive between the gate and source electrodes in response to the application to the external gate terminal of a protective operation cancellation signal which is set to a certain level outside the predetermined range of the drive signal. The protective operation is cancelled by the transition of the control element ($M_5$) to the non-conductive state in response to the reception of the cancellation signal on the external gate terminal, whereby the intended protective performance for the power MOSFET is accomplished.

Other objects and features of the present invention will become apparent from the following description of the embodiments.

DESCRIPTION OF THE PREFERRED EMBODIMENTS

Embodiments of this invention will be explained in detail with reference to the drawings.

Embodiment 1

Figure 1:
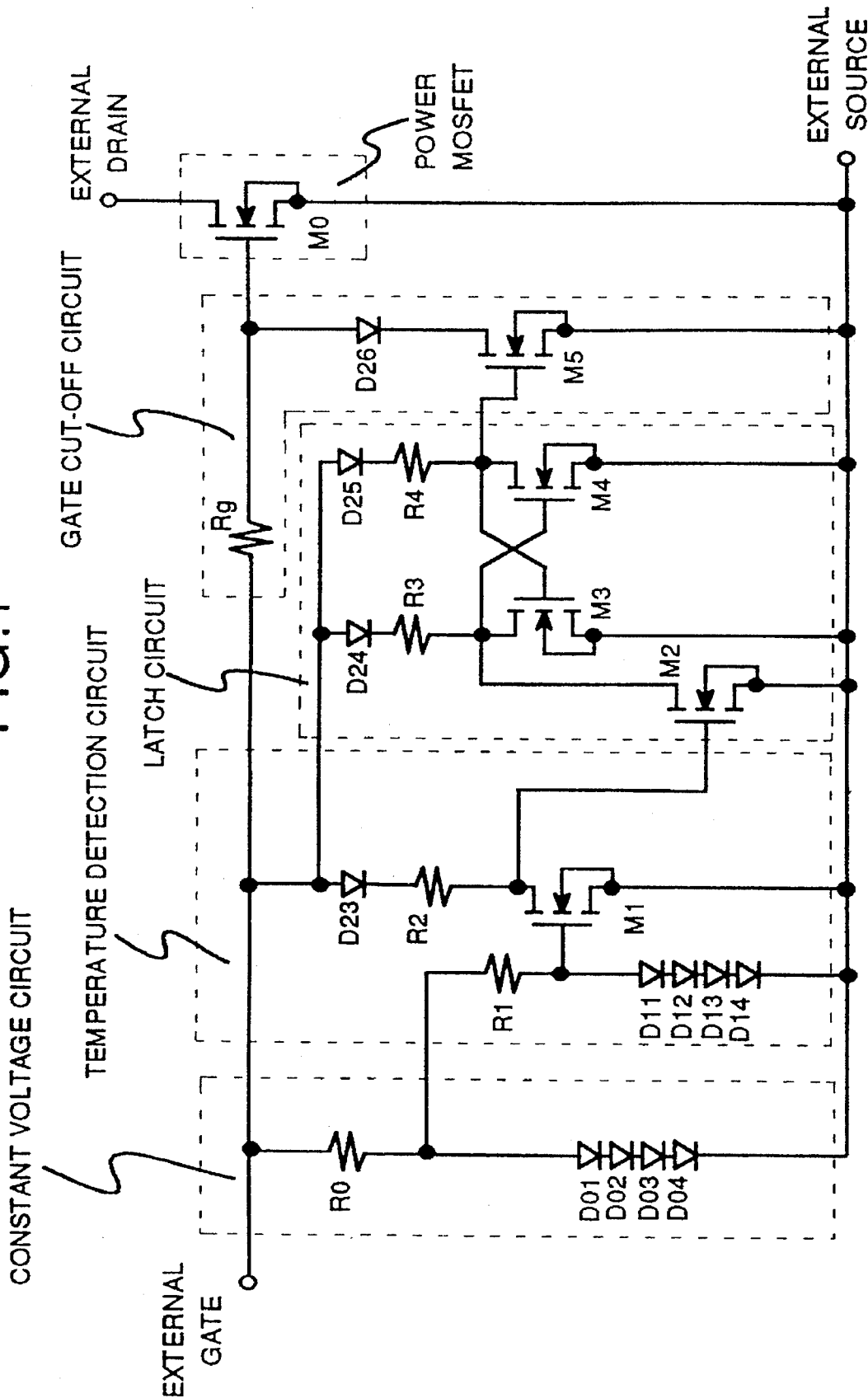
FIG. 1 is a schematic diagram showing an internal circuit arrangement of a first embodiment of the power MOSFET device of the present invention containing a power MOSFET coupled to a protection circuit.

FIG. 1 shows the internal circuit arrangement of the power MOSFET device based on a first embodiment of this invention, in which a power MOSFET $M_0$ of the output stage and a protection circuit are included on a single semiconductor chip.

The protection circuit for preventing the destruction of the power MOSFET basically consists of an operation state detection circuit for detecting the operational state of the power MOSFET, and a control circuit which controls the operation of the power MOSFET in a safe state in accordance with the output of the operation state detection circuit. Specifically, in this embodiment, the operation state detection circuit is a circuit for detecting the state of over-temperature of the semiconductor chip, and the control circuit is a gate cutoff circuit for the power MOSFET.

In operation, if the drain current of the power MOSFET $M_0$ increases abnormally by some reason, such as a short-circuit in the load circuit, the chip temperature will rise abnormally. The temperature detection circuit detects an excessive chip temperature, and the gate cutoff circuit operates in response to the output of the temperature detection circuit to turn on its output MOSFET $M_5$, thereby bringing the power MOSFET $M_0$ to a cutoff state. As a result, the drain current of the power MOSFET subsides, the chip temperature falls, and the power MOSFET M0 is prevented from being destroyed by the over-load condition.

The operation state detection circuit can otherwise be a current detection circuit which detects the value of current flowing on the drain-source path of the power MOSFET $M_0$, or a voltage detection circuit which detects the voltage value between the drain and source electrodes of the power MOSFET $M_0$. The gate cutoff circuit is controlled by the output of this current or voltage detection circuit.

In the embodiment of FIG. 1, the output of the temperature detection circuit is supplied to a latch circuit, an output of which controls the gate cutoff circuit. Accordingly, if the chip temperature rises abnormally, it is detected by the temperature detection circuit, and the detection output is latched by the latch circuit. Once the gate cutoff circuit commences the protective operation in response to the output of the latch circuit, it continues until the latch circuit is reset.

In the embodiment of FIG. 1, the latch circuit is not reset even if the external gate terminal is brought to zero volts. The input signal supplied to the external gate terminal for driving the power MOSFET $M_0$ in pulse mode is a pulse signal which swings between zero, or a slightly negative voltage, and a certain positive voltage, and the latch circuit is not reset by the input signal in this voltage range. Instead, the latch circuit is reset through the application, to the external gate terminal, of a reset voltage which lies outside the voltage range of the normal input signal, and consequently the protective operation of the gate cutoff circuit can be cancelled.

The temperature detection circuit and latch circuit are designed to operate by being supplied with a power voltage which derives from the input signal voltage applied to the external gate terminal, and accordingly these circuits do not need any special power source.

The temperature detection circuit bases its operation on a thermal sensor constructed from elements including a MOSFET $M_1$ which has a reference gate voltage supplied from a constant voltage circuit. This circuit arrangement ensures the high accuracy detection of temperature. The constant voltage circuit is made up of a diode train of four diodes $D_{01}$–$D_{04}$ which functions as a constant voltage element, and a resistor $R_0$ having a resistance incomparably greater than the impedance of the diode train. The constant voltage circuit can otherwise be configured by use of a zener diode, a serial connection of MOSFETs each in diode configuration, or a negative-feedback, constant voltage circuit based on a band gap reference generator or the like.

In the temperature detection circuit, the stabilized reference voltage produced by the constant voltage circuit is supplied to one terminal of a resistor $R_1$, which has another end connected to a diode train of four diodes $D_{11}$–$D_{14}$ which varies the voltage drop depending on the temperature. The diode train $D_{11}$–$D_{14}$ has a negative temperature coefficient greater than that of the resistor $R_1$, and therefore the divided voltage at the gate of the MOSFET $M_1$ falls as the temperature rises. The circuit parameters are selected such that when the chip temperature rises above 170° C. approximately, the voltage drop across the diode train $D_{11}$–$D_{14}$ falls below the threshold voltage of the MOSFET $M_1$ and it is cut off. Accordingly, with a positive input voltage being applied to the external gate terminal, the MOSFET $M_1$ has a high drain voltage.

The latch circuit basically consists of a MOSFET $M_2$ which functions as a set input element, a pair of MOSFETs $M_1$ and $M_2$ in a cross-coupled connection for their gate and drain electrodes, and load resistors $R_3$ and $R_4$. This latch circuit is an asymmetric flip-flop because of a higher resistance of the load resistor $R_4$ than $R_3$. Accordingly, when the chip temperature is low and thus the MOSFET $M_2$ is in a cutoff state, the asymmetric flip-flop stays with the non-conductive MOSFET $M_3$ and conductive MOSFET $M_4$, and the latter MOSFET $M_4$, which functions as a latch output element, has a low drain voltage.

The gate cutoff circuit basically consists of a MOSFET $M_5$ which functions as a control element, and a resistor Rg which serves as an impedance element.

When the chip temperature is low, the MOSFET $M_1$ is on, $M_2$ is off, $M_3$ is off, $M_4$ is on and $M_5$ is off, and the power MOSFET $M_0$ is driven by the pulse input signal applied to the external gate terminal to vary the current flow through the external drain and source terminals.

When the chip temperature rises above 170° C. approximately, the MOSFET $M_1$ becomes off, $M_2$ becomes on, the latch flip-flop is set, with its $M_3$ and $M_4$ being on and off, respectively, and the MOSFET $M_5$ of the gate cutoff circuit becomes on. Consequently, the power MOSFET $M_0$ of the output stage is brought to a non-conductive state, and the chip temperature will fall.

Once the protective operation for the power MOSFET $M_0$ by the latch circuit and gate cutoff circuit commences, the latch circuit is not reset due to the presence of a reverse current blocking diode $D_{25}$ in the flip-flop, even if the external gate signal is zero volts (i.e., the external gate voltage becomes equal to the external source voltage) or it is slightly negative for the reason mentioned in the following, and thus the protective operation continues.

In the n-channel MOSFETs $M_1$–$M_5$, a pn parasitic diode exists between the p-type base region of the back gate and the n-type drain region, and each of these MOSFETs has its back gate and source electrodes connected together. Even if the external gate is brought to a slightly negative voltage, current flowing from the external source to the external gate through the parasitic diodes of $M_1$–$M_5$ are retarded by the reverse current blocking diodes $D_{23}$–$D_{26}$, and accordingly useless power dissipation can be reduced. In case this power dissipation does not matter, the blocking diodes $D_{23}$, $D_{24}$, $D_{26}$ may be eliminated.

After the protective operation for the power MOSFET $M_0$ by the latch circuit and gate cutoff circuit has commenced, the n-channel MOSFET $M_5$ has its gate input capacitance charged to a high level. With the external gate voltage being at zero or a slightly negative voltage, the reverse current blocking diode $D_{25}$ in connection with the load resistor $R_4$ of the latch circuit prevents the gate input capacitance of the n-channel MOSFET $M_5$ from discharging. Therefore, the latch circuit is not reset and the protective operation performed by the latch circuit and gate cutoff circuit continues.

When the external gate is brought to a large negative voltage, the reverse current blocking diode $D_{25}$ in connection with the load resistor $R_4$ makes a breakdown, causing the gate input capacitance of $M_5$ to discharge. Consequently, the latch circuit is reset and the protective operation is cancelled. All of the reverse current blocking diodes $D_{23}$–$D_{26}$ may have an equal reverse breakdown voltage, or preferably the diode $D_{25}$ has a slightly lower breakdown voltage than the rest.

Embodiment 2

Figure 2:
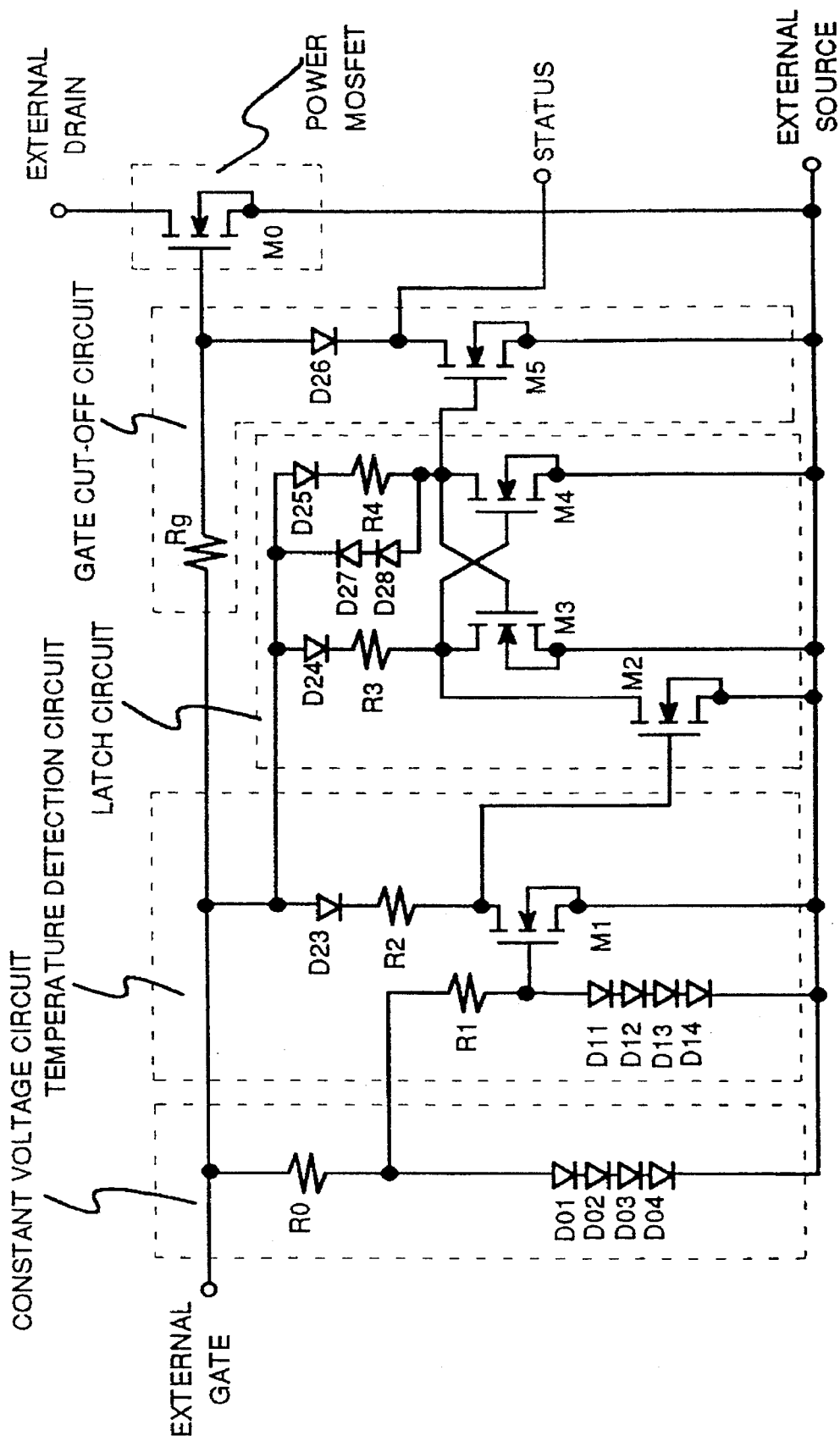
FIG. 2 is a schematic diagram showing an internal circuit arrangement of a second embodiment of the power MOSFET device of the present invention containing a power MOSFET coupled to a protection circuit, and a status terminal for providing an indication as to whether the protection circuit is activated.

FIG. 2 shows the internal circuit arrangement of the power MOSFET device based on the second embodiment of this invention. In the figure, elements equivalent to those of the first embodiment of FIG. 1 are referred to by the common symbols. The following explains only differences from the first embodiment.

In the latch circuit, a serial connection of diodes $D_{27}$ and $D_{28}$ is connected in parallel to the serial connection of the load resistor $R_4$ and reverse current blocking diode $D_{25}$. Accordingly, when the external gate is supplied with a negative voltage with a magnitude of bringing the diode train $D_{27}$–$D_{28}$ into the forward conduction, the gate input capacitance of the n-channel MOSFET $M_5$ discharges. Consequently, the latch circuit is reset and the protective operation performed by the latch circuit and gate cutoff circuit is cancelled.

In this embodiment, the MOSFET $M_5$ has its drain electrode led out to the exterior of the chip as a status terminal. After a positive input voltage has been applied to the external gate terminal and the protective operation commenced, the n-channel MOSFET $M_5$ has its gate input capacitance charged to a high level, causing it to become conductive. The low level status terminal, when the external gate terminal is high, signifies that the protective operation performed by the latch circuit and gate cutoff circuit is active.

An external controller such as a microprocessor monitors the status terminal, and upon detecting a low-level output on the status terminal, initiates a warning program and, when necessary, suspends the application of the input signal to the external gate terminal. The remaining operation is identical to the first embodiment.

Embodiment 3

Figure 3:
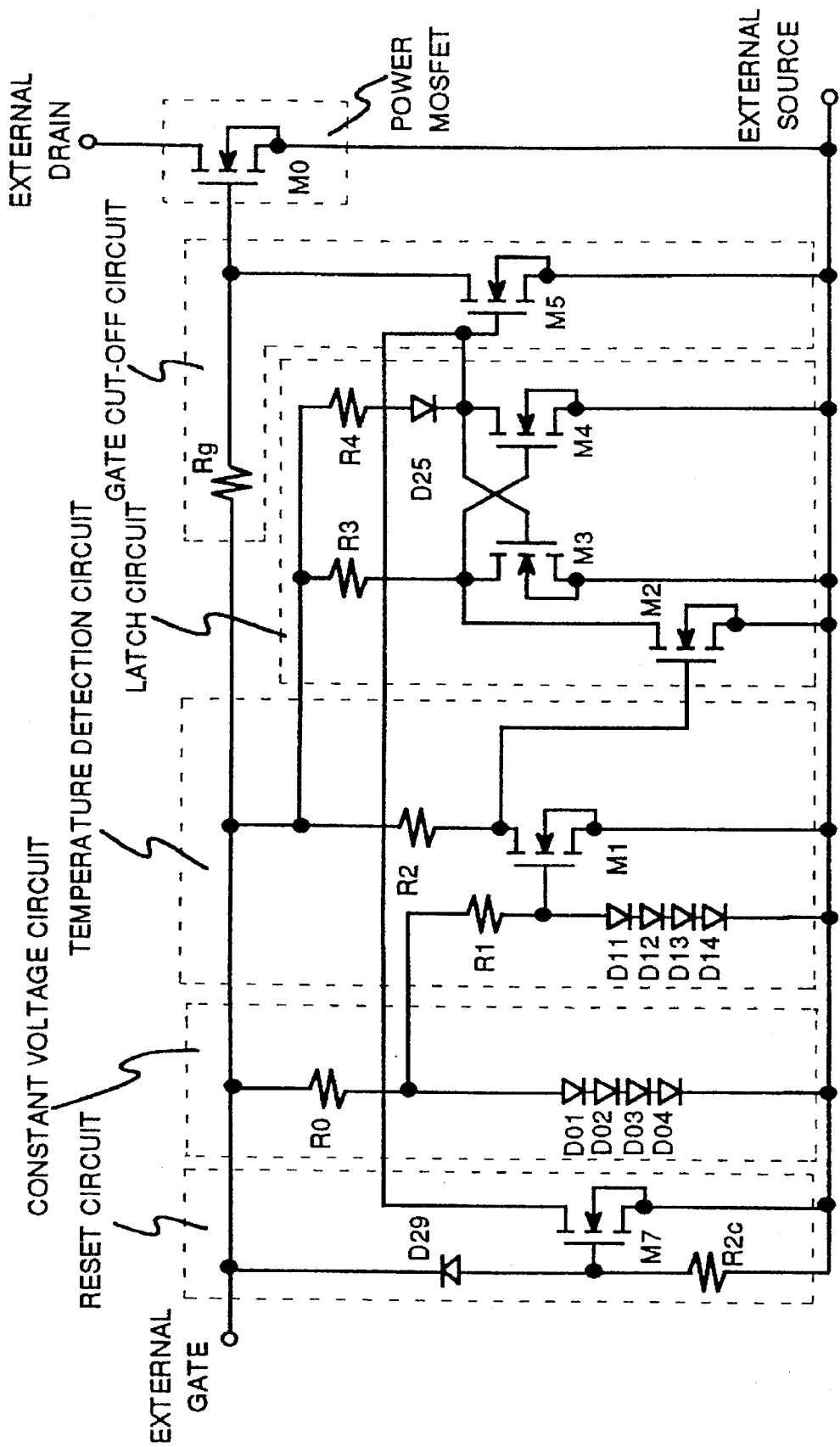
FIG. 3 is a schematic diagram showing an internal circuit arrangement of a third embodiment of the power MOSFET device of the present invention containing a power MOSFET coupled to a protection circuit, and a reset circuit for controlling operation of the protection circuit based on the magnitude of a voltage signal input into an external gate terminal of the power MOSFET device.

FIG. 3 shows the internal circuit arrangement of the power MOSFET device based on the third embodiment of this invention. In the figure, elements equivalent to those of the first embodiment of FIG. 1 are referred to by the common symbols. The following explains only differences from the first embodiment.

This embodiment includes a reset circuit which functions to detect a high voltage input to the external gate terminal and to control the gate cutoff circuit depending on the detected voltage level. When a positive voltage beyond the range of the normal input signal voltage is applied to the external gate terminal, a constant voltage diode $D_{29}$ in the reset circuit becomes conductive reversely, and the emergence of a voltage across a resistor $R_5$ turns on a MOSFET $M_7$ which serves as a voltage detecting element. The conductive MOSFET $M_7$ discharges the gate input capacitance of the n-channel MOSFET $M_5$. Consequently, the latch circuit is reset and the protective operation performed by the latch circuit and gate cutoff circuit is cancelled.

In the case where a zero or slightly negative voltage is applied to the external gate terminal, the reverse current blocking diode $D_{25}$ prevents the gate input capacitance of $M_5$ from discharging, and the protective operation is not cancelled. The remaining operation is identical to the first embodiment.

Embodiment 4

Figure 4:
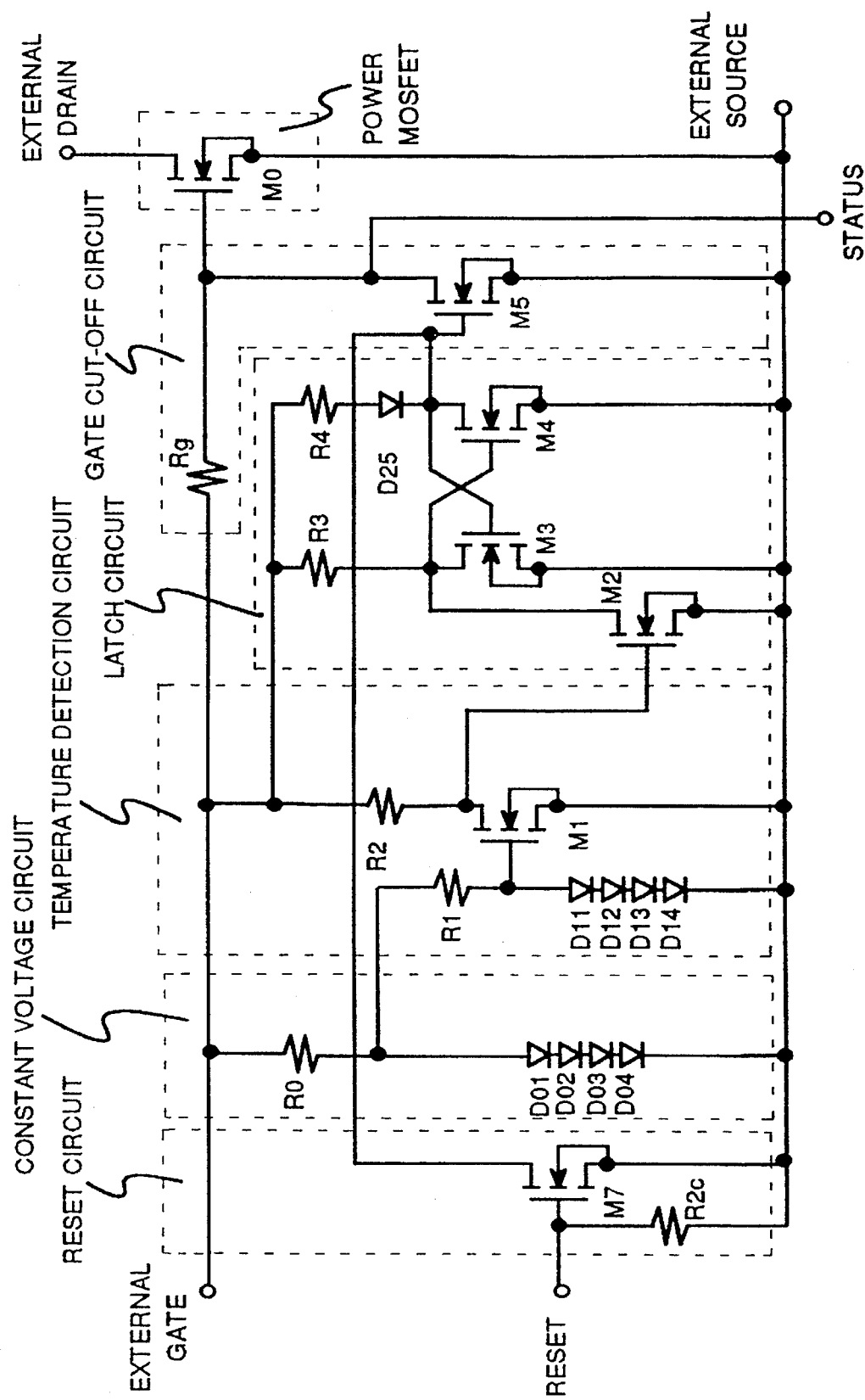
FIG. 4 is a schematic diagram showing an internal circuit arrangement of a fourth embodiment of the power MOSFET device of the present invention containing a power MOSFET coupled to a protection circuit, and a reset circuit for controlling operation of the protection circuit based on an independent control signal input into an external terminal of the reset circuit.

FIG. 4 shows the internal circuit arrangement of the power MOSFET device based on the fourth embodiment of this invention. This embodiment includes a reset circuit similar to that of the third embodiment. The reset circuit has a reset input terminal independent of the external gate terminal. When a positive voltage is applied to the reset input terminal, a MOSFET $M_7$ which serves as a voltage detecting element becomes conductive, causing the gate input capacitance of the n-channel MOSFET $M_5$ to discharge. Consequently, the protective operation performed by the latch circuit and gate cutoff circuit is cancelled. The MOSFET $M_5$ in the latch circuit has its drain electrode led out as a status terminal, as in the second embodiment. The remaining operation is identical to the preceding embodiments.

Embodiment 5

Figure 5:
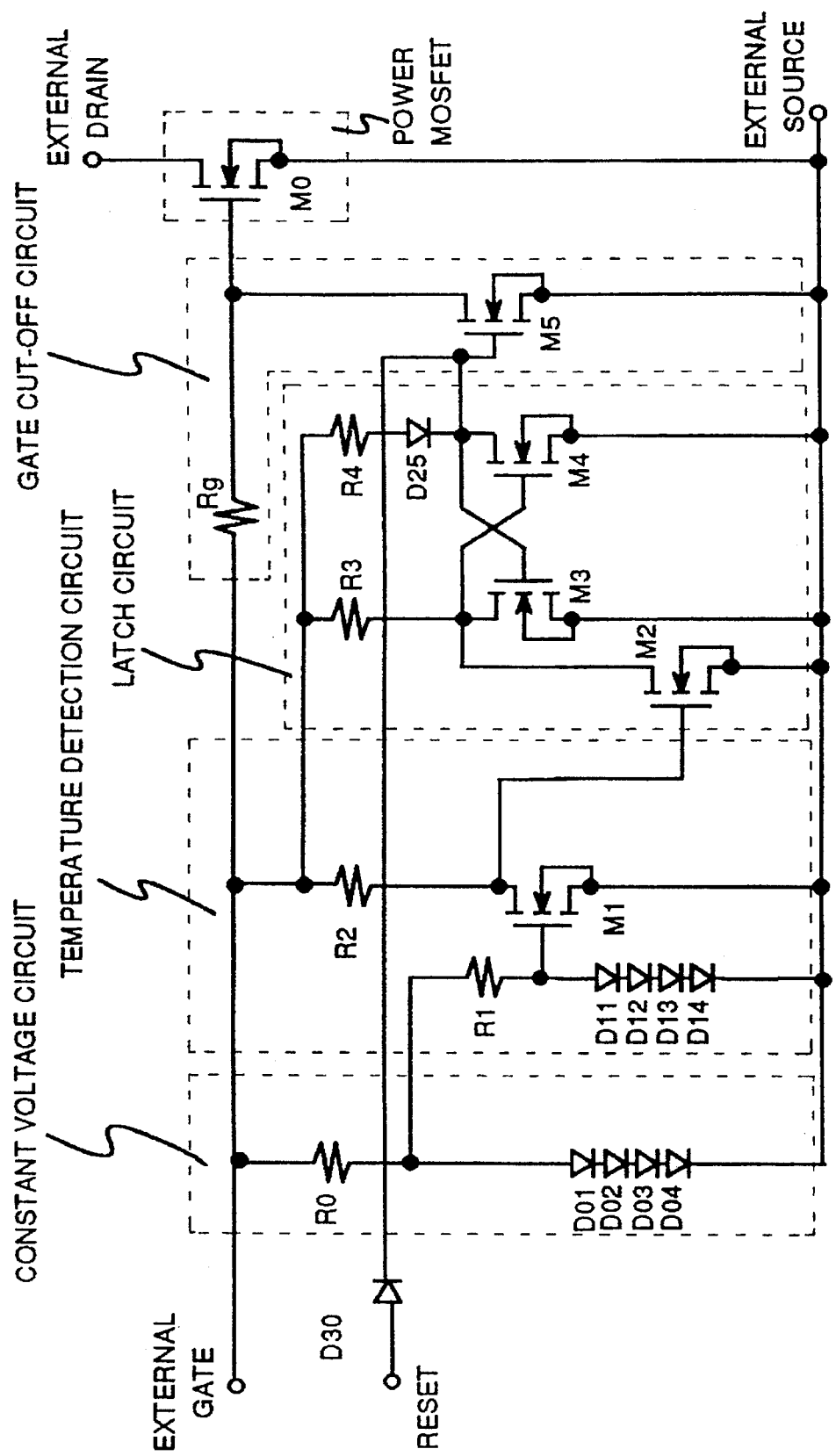
FIG. 5 is a schematic diagram showing an internal circuit arrangement of fifth embodiment of the power MOSFET device of the present invention containing a power MOSFET coupled to a protection circuit and a reset terminal, connected to a gate cut-off circuit, for receiving a signal for controlling operation of the protection circuit.

FIG. 5 shows the internal circuit arrangement of the power MOSFET device based on the fifth embodiment of this invention. This embodiment includes a reset input terminal connected through a diode $D_{30}$ to the gate of the MOSFET $M_5$. By application of a negative voltage which causes a reverse breakdown of the diode $D_{30}$ to the reset input terminal, the gate input capacitance of the MOSFET $M_5$ discharges. Consequently, the protective operation performed by the latch circuit and gate cutoff circuit is cancelled. The remaining operation is identical to the preceding embodiments.

Embodiment 6

Figure 6:
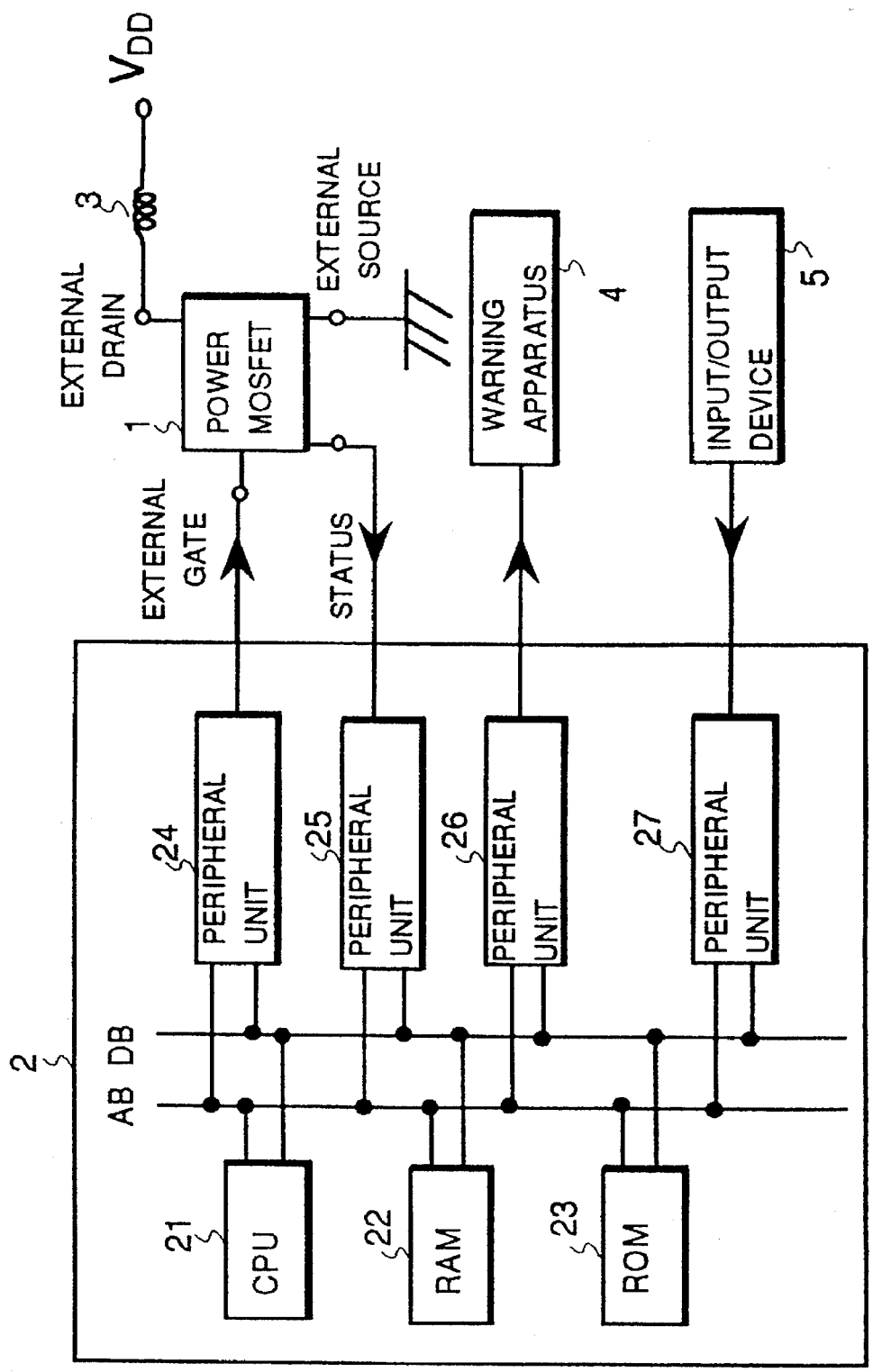
FIG. 6 is a block diagram showing an embodiment of a controller for driving the power MOSFET device of the present invention having a status terminal based on the embodiment shown in FIG. 2 or FIG. 4.

FIG. 6 shows an embodiment of the circuit configuration of a controller 2 for driving the power MOSFET device having the status terminal based on the embodiment shown in FIG. 2 or FIG. 4.

The controller 2 is a one-chip microcomputer consisting of a central processing unit (CPU) 21, an address bus (AB) and data bus (DB) connected to the CPU 21, a random access memory (RAM) 22 for storing data for the CPU 21, a read-only memory (ROM) 23 for storing instructions used by the CPU 21, and peripheral units 24, 25, 26 and 27. The external drain terminal of the power MOSFET device 1 is connected to drive an inductive load 3 such as the field winding of an electric motor.

The CPU 21 calculates the drive condition of the power MOSFET device 1 in accordance with the instructions stored in the ROM 23, and the resulting drive data is transferred to the peripheral unit 24. The peripheral unit 24 supplies a drive signal specified by the drive data to the external gate terminal of the power MOSFET device 1. The drive signal is a PWM (pulse width modulation) signal, for example.

The signal produced on the status terminal of the power MOSFET device 1 is delivered to the peripheral unit 25. The peripheral unit 25 monitors the status terminal, and upon detecting a low-level status output when the external gate terminal is high, reports the commencement of a protective operation to the CPU 21.

For the power MOSFET which does not have the status terminal, as in the cases of the embodiments of FIG. 1, FIG. 3 and FIG. 5, it is possible for the peripheral unit 25 to detect the commencement of a protective operation by monitoring the current flowing through the external gate terminal by utilization of the fact that the external gate current of the power MOSFET device 1 increases by the order of one digit approximately when the over-temperature cutoff action takes place.

As another method, a thermocouple is used to transform the chip temperature into an electrical signal, the peripheral unit 25 converts this analog signal into digital data, and the CPU 21 analyzes, in accordance with the instruction stored in the ROM 23, the data to detect a sharp fall of the chip temperature following a rise to an abnormal level after the A/D conversion by the peripheral unit 25, thereby detecting the commencement of protective operation. Still another method of detecting the commencement of protective operation is that the peripheral unit 25 monitors the occurrence of the states that the power MOSFET device 1 has a high external gate terminal voltage, a high drain voltage and no drain current, all at the same time.

After the over-temperature protective operation has commenced, the n-channel MOSFET $M_5$ becomes conductive, and the device cutoff state is not reset erroneously even if the input PWM signal is kept applied to the external gate terminal.

In the case of using the power MOSFET device 1 shown in FIG. 1 or FIG. 2, the controller 2 maintains the external gate signal at a level virtually equal to the normal signal level, and it does not become such a negative voltage as to turn off the control MOSFET $M_5$.

In the case of using the power MOSFET device 1 shown in FIG. 3, the controller 2 maintains the external gate signal at a level virtually equal to the normal signal level, and it does not become such a positive voltage as to turn off the control MOSFET $M_5$.

In the case of using the power MOSFET device 1 shown in FIG. 4, the controller 2 maintains the external gate signal at a level virtually equal to the normal signal level and the reset signal at the low level, and the control MOSFET $M_5$ does not turn off due to the reverse breakdown of the diode $D_{25}$ or the conduction of the reset MOSFET $M_7$.

In the case of using the power MOSFET device 1 shown in FIG. 5, the controller 2 maintains the external gate signal at a level virtually equal to the normal signal level and the reset signal at about zero volts, and the control MOSFET $M_5$ does not turn off due to the reverse breakdown of the diode $D_{30}$.

In response to the commencement of protective operation, the CPU 21 initiates a warning program stored in the ROM 23, and then the peripheral unit 26 activates a warning device 4 which is a buzzer or a light emitting diode. The CPU 21 further initiates a deactivation program stored in the ROM 23, and then the peripheral unit 24 suspends the delivery of the input signal to the external gate terminal so as to avoid a useless current flow in the control MOSFET $M_5$ which is kept conductive during the protective operation.

After the commencement of protective operation, the deactivation program operates on the peripheral unit 24 to activate the power MOSFET device 1 a prescribed number of times for a prescribed duration so as to verify whether the device is really in an abnormal state or the protective operation is erroneously induced by a noise or the like. If the protective operation takes place again after the trial activation, it is possible for the CPU 21 to lower the duty cycle of the power MOSFET device 1 gradually so as to avoid abrupt deactivation of the load.

During the protective operation by the protection circuit incorporated within the chip of the power MOSFET device 1, the user notices the warning signal. The user checks the state of the load 3, supply voltage $V_{DD}$ and the like thereby to restore the safe operational environment by getting rid of the adverse condition. After that, the user enters the restart command on the input/output device 5, and the peripheral unit 27 takes the interrupt action for the CPU 21. Then, the CPU 21 initiates the operation restart program stored in the ROM 23, and the peripheral unit 24 sends the protective operation cancellation signal to the power MOSFET device 1 as follows.

In the case of using the power MOSFET device 1 shown in FIG. 1 or FIG. 2, the peripheral unit 24 produces a negative voltage for the cancellation signal applied to the external gate terminal so that the control MOSFET $M_5$ is turned off and the protective operation is cancelled, and after the protective operation is cancelled it restores the normal signal level of the external gate drive signal.

In the case of using the power MOSFET device 1 shown in FIG. 3, the peripheral unit 24 produces a positive voltage for the cancellation signal applied to the external gate terminal so that the control MOSFET $M_5$ is turned off and the protective operation is cancelled, and after the protective operation is cancelled it restores the normal signal level of the external gate drive signal.

In the case of using the power MOSFET device 1 shown in FIG. 4, the peripheral unit 24 produces a positive voltage for the cancellation signal applied to the reset terminal so that the control MOSFET $M_5$ is turned off, and after the protective operation is cancelled it restores the normal signal level of the external gate drive signal.

In the case of using the power MOSFET device 1 shown in FIG. 5, the peripheral unit 24 produces a negative voltage for the cancellation signal applied to the reset terminal so that the control MOSFET $M_5$ is turned off, and after the protective operation is cancelled it restores the normal signal level of the external gate drive signal.

Although preferred embodiments of this invention have been explained in detail, this invention is not confined to these embodiments, but various modifications are possible within the scope of the conception.

For example, the embodiments of FIG. 1, FIG. 3 and FIG. 5 may be provided with the status terminal.

In the embodiments of FIG. 1 through FIG. 5, it is desirable to connect a noise by-passing capacitor at a proper node of the constant voltage circuit or temperature detection circuit so as to prevent the latch circuit from malfunctioning due to noises introduced through the external gate terminal. This noise by-passing capacitor can be made as a MIS capacitor formed of the polycrystalline silicon gate, gate oxide film and p-type well impurity layer formed for the power MOSFET, without the need of additional fabricating processes.

In the case of using the p-type well impurity layer of the power MOSFET having a higher surface concentration than the p-type well impurity layer formed for the MOSFET in the protection circuit, the channel inversion in the p-well region at the application of a voltage to the noise by-passing capacitor can be prevented and the increase in the parasitic resistance of the capacitor can be suppressed.

It is also possible to integrate MOS logic circuits or analog amplifying circuits on the same semiconductor chip based on the embodiments shown in FIG. 1 through FIG. 5.

The embodiment of FIG. 6 may be modified to configure a source follower drive circuit by connecting the load 3 to the external source terminal of the power MOSFET device 1, with its external drain terminal being connected directly to the power supply $V_{DD}$.

Although the foregoing embodiments of this invention is pertinent to the n-channel power MOSFET device, semiconductor devices of p-channel MOSFETs having the same functions as described above can be formed by using p-channel MOSFETs in the protection circuit.

According to the present invention, the semiconductor device is protected against the destructive operating conditions and the protective operation is not cancelled erroneously by the normal input signal.

What is claimed is:

1. A semiconductor device comprising:
 a power MOSFET;
 an operation state detection circuit which carries out a detecting operation of an electrical signal related to an operation state of said power MOSFET;
 a latch circuit which latches an output signal from the operation state detection circuit so as to protect said power MOSFET from damage in response to said detecting operation of said operation state detection circuit;
 a control element which causes a conductive path to be created between a gate electrode and a source electrode of said power MOSFET in response to said output signal of said latch circuit, to thereby cause said power MOSFET to enter a non-conductive state; and
 an external gate terminal which supplies a drive signal to the gate electrode of said power MOSFET, wherein a voltage of said drive signal supplied to said external gate terminal is also employed as a power supply voltage for said operation state detection circuit and said latch circuit, wherein said output signal of said latch circuit charges an input capacitance of a control input of said control element, wherein a reverse current blocking diode is coupled between said control input of said control element and said external gate terminal so as to prevent said input capacitance of said control input of said control element from discharging in case that said voltage of said drive signal supplied to said external gate terminal is zero, wherein said drive signal has a signal level in a predetermined range, and wherein said control element causes said path between said gate electrode and said source electrode of said power MOSFET to become non-conductive in response to an application to said external gate terminal of a cancellation signal having a signal level outside said predetermined range of the drive signal, to thereby cause said power MOSFET to enter a conductive state.

2. A semiconductor device according to claim 1,
wherein said power MOSFET is an n-channel MOSFET,
wherein said control element is an n-channel control MOSFET, and
wherein said latch circuit includes an asymmetric flip-flop including a first and second load elements having different load resistance values and a first and second n-channel drive MOSFETs drain electrodes and gate electrodes thereof being cross-coupled, and a set input n-channel MOSFET having a gate electrode driven by a detection output of said operation state detection circuit and having a drain electrode coupled to a first node at which said first load element, the drain electrode of said first n-channel drive MOSFET and the gate electrode of said second n-channel drive MOSFET are coupled together, wherein a second node, at which said second load element, the drain electrode of said second n-channel drive MOSFET and the gate electrode of said first n-channel drive MOSFET of said asymmetric flip-flop are coupled together, is coupled with a gate electrode of said n-channel control MOSFET, and wherein, when said drive signal is applied to said external gate terminal and said set input n-channel MOSFET is made non-conductive by an output of said operation state detection circuit, said second node has a voltage lower than that of said first node and consequently said n-channel control MOSFET is brought to a non-conductive state.

3. A semiconductor device according to claim 2,
wherein said detecting operation of said operation state detection circuit causes said set input n-channel MOSFET to become conductive, and consequently said latch circuit latches said output signal so as to commence protective operation for said power MOSFET,
wherein said first reverse current blocking diode is coupled in series to said second load element, and
wherein a current flows through said first reverse current blocking diode in response to said application of said cancellation signal, which has said signal level outside said predetermined range, to said external gate terminal, and consequently said n-channel control MOSFET becomes non-conductive and said protective operation for said power MOSFET is canceled.

4. A semiconductor device according to claim 3, further comprising:

a constant voltage circuit which is supplied with said drive voltage of said external gate terminal, wherein said operation state detection circuit comprises a temperature detection circuit which detects a chip temperature of said semiconductor device, and said temperature detection circuit includes a temperature detecting n-channel MOSFET a gate electrode of which is biased by a voltage derived from a reference voltage produced by said constant voltage circuit.

5. A semiconductor device according to claim 4, wherein said reference voltage of said constant voltage circuit is supplied to said gate electrode of said temperature detecting n-channel MOSFET through a voltage division circuit having temperature-dependent characteristics.

6. A semiconductor device according to claim 2, wherein a drain electrode of said n-channel control MOSFET is led out to the exterior of said device as a status terminal.

7. A semiconductor device according to claim 3, wherein a drain electrode of said n-channel control MOSFET is led out to the exterior of said device as a status terminal.

8. A semiconductor device according to claim 4, wherein a drain electrode of said n-channel control MOSFET is led out to the exterior of the device as a status terminal.

9. A semiconductor device according to claim 5, wherein a drain electrode of said n-channel control MOSFET is led out to the exterior of said device as a status terminal.

10. A semiconductor device according to claim 3, wherein a series combination of a plurality of diodes is coupled in parallel with a serial connection of said second load element and said first reverse current blocking diode in the reverse direction of rectifying direction of said first reverse current blocking diode, and wherein a current flow through said series combination of said plurality of diodes in response to the application of the cancellation signal to said external gate terminal, and consequently said n-channel control MOSFET becomes non-conductive and the protective operation for said power MOSFET is canceled.

11. A semiconductor device according to claim 10, further comprising:

a constant voltage circuit which is supplied with said drive voltage of said external gate terminal, wherein said operation state detection circuit comprises a temperature detection circuit which detects a chip temperature of said semiconductor device, and said temperature detection circuit includes a temperature detecting n-channel MOSFET a gate electrode of which is biased by a voltage derived from a reference voltage produced by said constant voltage circuit.

12. A semiconductor device according to claim 11, wherein said reference voltage of said constant voltage circuit is supplied to said gate electrode of said temperature detecting n-channel MOSFET through a voltage division circuit having temperature-dependent characteristics.

13. A semiconductor device according to claim 10, wherein a drain electrode of said n-channel control MOSFET is led out to the exterior of said device as a status terminal.

14. A semiconductor device according to claim 11, wherein a drain electrode of said n-channel control MOSFET is led out to the exterior of said device as a status terminal.

15. A semiconductor device according to claim 12, wherein a drain electrode of said n-channel control MOSFET is led out to the exterior of said device as a status terminal.

16. A semiconductor device according to claim 2, further comprising:

a high voltage detection circuit which detects a high voltage applied to said external gate terminal, wherein said detecting operation of said operation state detection circuit causes said set input n-channel MOSFET to become conductive, and consequently said latch circuit latches said output signal so as to commence a protective operation for said power MOSFET, wherein said first reverse current blocking diode is coupled in series to said second load element, wherein said high voltage, which has said signal level outside said predetermined range, applied to said external gate terminal is used as the cancellation signal, wherein, when said high voltage is applied to said external gate terminal, a detection output of said high voltage detection circuit causes said n-channel control MOSFET to become non-conductive, and consequently said protective operation for said power MOSFET is canceled.

17. A semiconductor device according to claim 16, further comprising:

a constant voltage circuit which is supplied with said drive voltage of said external gate terminal, wherein said operation state detection circuit comprises a temperature detection circuit which detects a chip temperature of said semiconductor device, and said temperature detection circuit includes a temperature detecting n-channel MOSFET a gate electrode of which is biased by a voltage derived from a reference voltage produced by said constant voltage circuit.

18. A semiconductor device according to claim 17, wherein said reference voltage of said constant voltage circuit is supplied to said gate electrode of said temperature detecting n-channel MOSFET through a voltage division circuit having temperature-dependent characteristics.

19. A semiconductor device according to claim 16, wherein a drain electrode of said n-channel control MOSFET is led out to the exterior of said device as a status terminal.

20. A semiconductor device according to claim 17, wherein a drain electrode of said n-channel control MOSFET is led out to the exterior of said device as a status terminal.

21. A semiconductor device according to claim 18, wherein a drain electrode of said n-channel control MOSFET is led out to the exterior of said device as a status terminal.

22. A semiconductor device comprising:

a power MOSFET;

an operation state detection circuit which carries out a detecting operation of an electrical signal related to an operation state of said power MOSFET;

a latch circuit which latches an output signal from the operation state detection circuit so as to protect said power MOSFET from damage thereof in response to said detecting operation of said operation state detection circuit;

a control element which causes a a conductive path to be created between a gate electrode and a source electrode of said power MOSFET in response to said output signal of said latch circuit, to thereby cause said power MOSFET to enter a non-conductive state;

an external gate terminal which supplies a drive signal to the gate electrode of said power MOSFET, an external reset terminal; and a signal detection circuit coupled to said external reset terminal, wherein a voltage of said drive signal supplied to said external gate terminal is also employed as a power supply voltage of said operation state detection circuit and said latch circuit, and wherein said output signal of said latch circuit charges an input capacitance of a control input of said control element, wherein a reverse current blocking diode is coupled between said control input of said control element and said external gate terminal so as to prevent said input capacitance of said control input of said control element from discharging in case that said voltage of said drive signal supplied to said external gate terminal is zero, and wherein a detection output of said signal detection circuit controls said control element in such a way as to cause said path between said gate electrode and said source electrode of said power MOSFET to become non-conductive in response to an application of a cancellation signal to said external reset terminal, to thereby cause said power MOSFET to enter a conductive state.

23. A semiconductor device according to claim 22, wherein said power MOSFET is an n-channel MOSFET, wherein said control element is an n-channel control MOSFET, and wherein said latch circuit includes an asymmetric flip-flop including a first and second load elements having different load resistance values and a first and second n-channel drive MOSFETs drain electrodes and gate electrodes thereof being cross-coupled, and a set input n-channel MOSFET having a gate electrode driven by a detection output of said operation state detection circuit and having a drain electrode coupled to a first node at which said first load element, the drain electrode of said first n-channel drive MOSFET and the gate electrode of said second n-channel drive MOSFET are coupled together, wherein a second node, at which said second load element, the drain electrode of said second n-channel drive MOSFET and the gate electrode of said first n-channel drive MOSFET of said asymmetric flip-flop are coupled together, is coupled with a gate electrode of said n-channel control MOSFET, and wherein, when said drive signal is applied to said external gate terminal and said set input n-channel MOSFET is made non-conductive by an output of said operation state detection circuit, said second node has a voltage lower than that of said first node and consequently said n-channel control MOSFET is brought to a non-conductive state.

24. A semiconductor device according to claim 23, wherein said detecting operation of said operation state detection circuit causes said set input n-channel MOSFET to become conductive, and consequently said latch circuit latches said output signal so as to commence a protective operation for said power MOSFET, wherein said first reverse current blocking diode is coupled in series to said second load element, and wherein said detection output of said signal detection circuit causes said n-channel control MOSFET to become non-conductive in response to said application of said cancellation signal to said external reset terminal, and consequently a protective operation for said power MOSFET is canceled.

25. A semiconductor device according to claim 24, further comprising:

a constant voltage circuit which is supplied with said drive voltage of said external gate terminal, wherein said operation state detection circuit comprises a temperature detection circuit which detects a chip temperature of said semiconductor device, and said temperature detecting n-channel MOSFET a gate electrode of which is biased by a voltage derived from a reference voltage produced by said constant voltage circuit.

26. A semiconductor device according to claim 25, wherein said reference voltage of said constant voltage circuit is supplied to said gate electrode of said temperature detecting n-channel MOSFET through a voltage division circuit having temperature-dependent characteristics.

27. A semiconductor device according to claim 23, wherein a drain electrode of said n-channel control MOSFET is led out to the exterior of said device as a status terminal.

28. A semiconductor device according to claim 24, wherein a drain electrode of said n-channel control MOSFET is led out to the exterior of said device as a status terminal.

29. A semiconductor device according to claim 25, wherein a drain electrode of said n-channel control MOSFET is led out to the exterior of said device as a status terminal.

30. A semiconductor device according to claim 26, wherein a drain electrode of said n-channel control MOSFET is led out to the exterior of said device as a status terminal.

31. A semiconductor device comprising:

a power MOSFET;

an operation state detection circuit which carries out a detecting operation of an electrical signal related to an operation state of said power MOSFET;

a latch circuit which latches an output signal of said operation state detection circuit so as to protect said power MOSFET from damage thereof in response to said detecting operation of said operation state detection circuit;

a control element which causes a conductive path to be created between a gate electrode and a source electrode of said power MOSFET in response to said output signal of said latch circuit, to thereby cause said power MOSFET to enter a non-conductive state;

an external gate terminal which supplies a drive signal to the gate electrode of said power MOSFET, an external reset terminal; and a reset diode coupled to said external reset terminal, wherein a voltage of said drive signal supplied to said external gate terminal is also employed as a power supply voltage of said operation state detection circuit and said latch circuit, wherein said output signal of said latch circuit charges an input capacitance of a control input of said control element, wherein a reverse current blocking diode is coupled between said control input of said control element and said external gate terminal so as to prevent said input capacitance of said control input of said control element from discharging in case that said voltage of said drive signal supplied to said external gate terminal is zero, and wherein said reset diode coupled to said external reset terminal assumes reverse breakdown through an application of a cancellation signal to said external reset terminal and a current emerging due to said reverse breakdown of said reset diode controls said control element in such a way as to cause said path between said gate electrode and said source electrode of said power MOSFET to become non-conductive, to thereby cause said power MOSFET to enter a conductive state.

32. A semiconductor device according to claim 31, wherein said power MOSFET is an n-channel MOSFET, wherein said control element is an n-channel control MOSFET, and wherein said latch circuit includes an asymmetric flip-flop including a first and second load elements having different load resistance values and a first and second n-channel drive MOSFETS drain electrodes and gate electrodes thereof being cross-coupled, and a set input n-channel MOSFET having a gate electrode driven by a detection output of said operation state detection circuit and having a drain electrode coupled to a first node at which said first load element, the drain electrode of said first n-channel drive MOSFET and the gate electrode of said second n-channel drive MOSFET are coupled together, wherein a second node, at which said second load element, the drain electrode of said second n-channel drive MOSFET and the gate electrode of said first n-channel drive MOSFET of said asymmetric flip-flop are coupled together, is coupled with a gate electrode of said n-channel control MOSFET, and wherein, when said drive signal is applied to said external gate terminal and said set input n-channel MOSFET is made non-conductive by an output of said operation state detection circuit, said second node has a voltage lower than that of said first node and consequently said n-channel control MOSFET is brought to a non-conductive state.

33. A semiconductor device according to claim 32, wherein said detecting operation of said operation state detection circuit causes said set input n-channel MOSFET to become conductive, and consequently said latch circuit latches said output signal so as to commence a protective operation for said power MOSFET, wherein said first reverse current blocking diode is coupled in series to said second load element, and wherein said reverse breakdown current emerging in response to said application of said cancellation signal to said external reset terminal causes said n-channel control MOSFET to become non-conductive, and consequently a protective operation for said power MOSFET is canceled.

34. A semiconductor device according to claim 33, further comprising:

a constant voltage circuit which is supplied with said drive voltage of said external gate terminal, wherein said operation state detection circuit comprises a temperature detection circuit which detects a chip temperature of said semiconductor device, and said temperature detection circuit includes a temperature detecting n-channel MOSFET a gate electrode of which is biased by a voltage derived from a reference voltage produced by said constant voltage circuit.

35. A semiconductor device according to claim 34, wherein said reference voltage of said constant voltage circuit is supplied to said gate electrode of said temperature detecting n-channel MOSFET through a voltage division circuit having temperature-dependent characteristics.

36. A semiconductor device according to claim 32, wherein a drain electrode of said n-channel control MOSFET is led out to the exterior of said device as a status terminal.

37. A semiconductor device according to claim 33, wherein a drain electrode of said n-channel control MOSFET is led out to the exterior of said device as a status terminal.

38. A semiconductor device according to claim 34, wherein a drain electrode of said n-channel control MOSFET is led out to the exterior of said device as a status terminal.

39. A semiconductor device according to claim 35, wherein a drain electrode of said n-channel control MOSFET is led out to the exterior of said device as a status terminal.

40. A semiconductor device comprising:

a power output device;

an operation state detection and latch circuit which carries out a detecting operation of an electric signal related to an operation state of said power output device to produce an output signal, and which latches the output signal so as to protect said power output device from damage thereof in response to said detecting operation;

a control MOSFET which creates a conductive path between a gate electrode and a source electrode of said power output device in response to said output signal of said operation state detection and latch circuit; and an external gate terminal which supplies a drive signal to said gate electrode of said power output device, wherein a voltage of said drive signal supplied to said external gate terminal is also employed as a power supply voltage for said operation state detection and latch circuit, wherein said operation state detection and latch circuit includes an output stage containing an output MOSFET, a drain electrode thereof being coupled with said external gate terminal via a load element, wherein said output signal of said operation state detection and latch circuit is generated from said drain electrode of said output MOSFET of said output stage of said operation state detection and latch circuit, wherein said output signal of said operation state detection and latch circuit charges a gate input capacitance of said control MOSFET, and wherein a reverse current blocking diode is coupled between said gate electrode of said control MOSFET and said external gate terminal so as to prevent said gate input capacitance of said control MOSFET from discharging in case that said voltage of said drive signal supplied to said external gate terminal is zero.

41. A semiconductor device according to claim 40, wherein said power output device is an n-channel MOSFET, and wherein said control MOSFET is an n-channel MOSFET.

* * * * *